United States Patent
Lin et al.

(10) Patent No.: US 10,459,693 B2
(45) Date of Patent: Oct. 29, 2019

(54) RANDOM CODE GENERATOR WITH DIFFERENTIAL CELLS AND ASSOCIATED CONTROL METHOD

(71) Applicant: eMemory Technology Inc., Hsin-Chu (TW)

(72) Inventors: Chun-Hung Lin, Hsinchu (TW); Chun-Hung Lu, Hsinchu (TW); Shih-Chan Huang, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/047,343

(22) Filed: Jul. 27, 2018

(65) Prior Publication Data
US 2019/0114144 A1    Apr. 18, 2019

Related U.S. Application Data

(60) Provisional application No. 62/571,833, filed on Oct. 13, 2017.

(51) Int. Cl.
| | |
|---|---|
| *G06F 7/58* | (2006.01) |
| *G11C 17/16* | (2006.01) |
| *G11C 17/18* | (2006.01) |
| *G11C 5/14* | (2006.01) |
| *G11C 7/10* | (2006.01) |
| *G11C 16/04* | (2006.01) |
| *G11C 16/10* | (2006.01) |
| *G11C 16/26* | (2006.01) |
| *G11C 16/30* | (2006.01) |
| *G11C 16/06* | (2006.01) |
| *H01L 27/11519* | (2017.01) |

(52) U.S. Cl.
CPC ............ *G06F 7/588* (2013.01); *G11C 5/14* (2013.01); *G11C 7/1084* (2013.01); *G11C 16/0408* (2013.01); *G11C 16/0433* (2013.01); *G11C 16/06* (2013.01); *G11C 16/10* (2013.01); *G11C 16/26* (2013.01); *G11C 16/30* (2013.01); *G11C 17/16* (2013.01); *G11C 17/165* (2013.01); *G11C 17/18* (2013.01); *H01L 27/11519* (2013.01)

(58) Field of Classification Search
CPC ......... G06F 7/588; G11C 5/14; G11C 7/1084; G11C 16/0408; G11C 16/0433
USPC .................................................... 365/185.18
See application file for complete search history.

(56) References Cited

U.S. PATENT DOCUMENTS 5,091,879 A * 2/1992 Tran .................. G11C 11/419
                                                      327/52
9,613,714 B1    4/2017 Wong et al.
(Continued)

OTHER PUBLICATIONS

European Patent Office Search Report dated Jan. 24, 2019.

*Primary Examiner* — Harry W Byrne
(74) *Attorney, Agent, or Firm* — WPAT, PC

(57) ABSTRACT

A random code generator includes a differential cell array, a power circuit, a voltage detector, a control circuit and a read/write circuit. The power circuit provides a supply voltage to a node. The differential cell array includes plural differential cells. Each differential cell includes two sub-cells. The two sub-cells have process variations. During the enrollment, one sub-cell is programmed, and the other sub-cell is subjected to a program inhibition. In addition, a random code is generated according to the storage state of the differential cell.

16 Claims, 8 Drawing Sheets

(56) References Cited

U.S. PATENT DOCUMENTS

2009/0251942 A1    10/2009   Damien
2016/0328578 A1    11/2016   Plusquellic et al.
2017/0200508 A1     7/2017   Grigoriev et al.

* cited by examiner

| | WL | CLs | BL1 | BL2 |
|---|---|---|---|---|
| PGM (1st storage state) | Vsel | Vpp | 0V | Vpp |
| PGM (2nd storage state) | Vsel | Vpp | Vpp | 0V |
| READ | Vsel | Vr | 0V | 0V |

|  | WL | CLaf | BL1 | BL2 |
|---|---|---|---|---|
| PGM (1st storage state) | Vsel | Vpp | 0V | Vpp |
| PGM (2nd storage state) | Vsel | Vpp | Vpp | 0V |
| READ | Vsel | Vr | 0V | 0V |

|  | BL1 | WL | AF1 | IG | AF2 | BL2 |
|---|---|---|---|---|---|---|
| PGM | 0V | Vdd | Vpp | Von | Vpp | 0V |
| READ | 0V | Vdd | Vr | Voff | Vr | 0V |

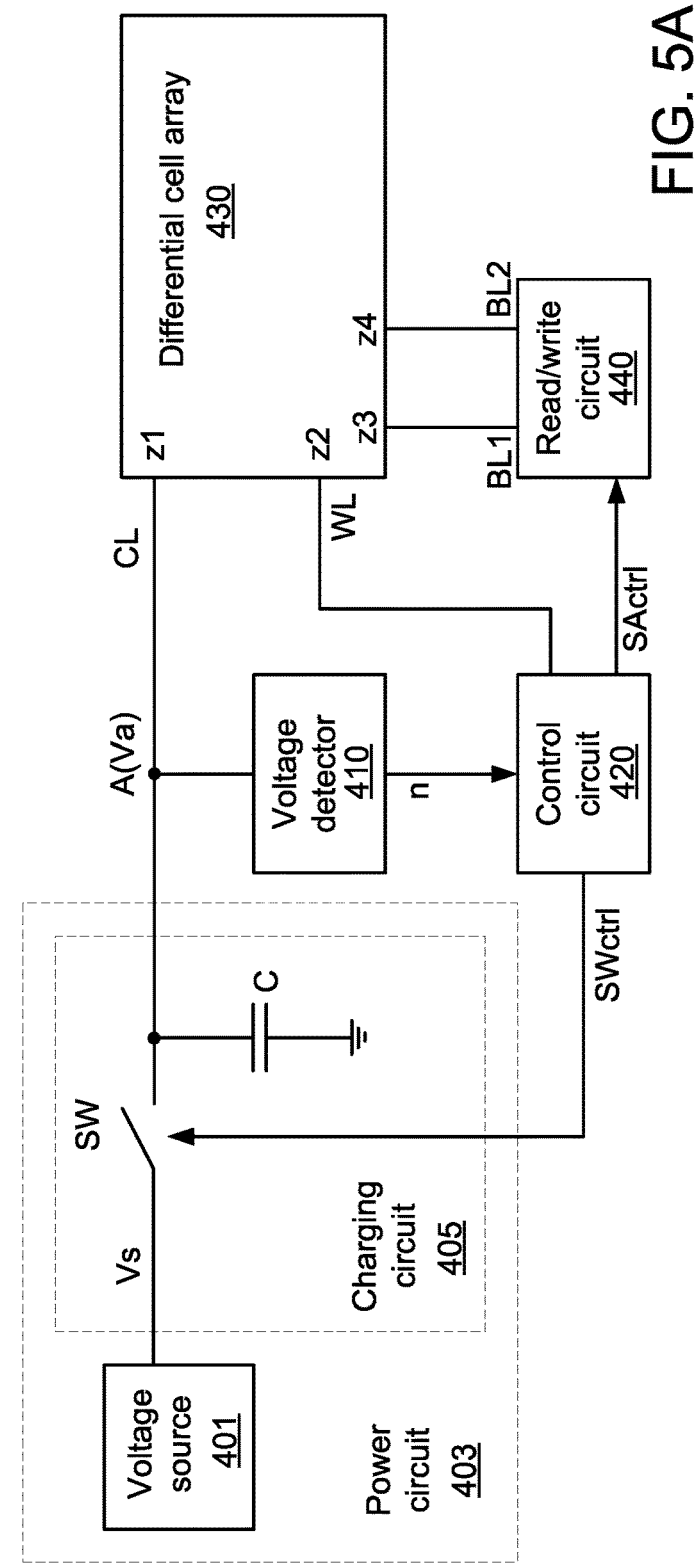

RANDOM CODE GENERATOR WITH DIFFERENTIAL CELLS AND ASSOCIATED CONTROL METHOD

This application claims the benefit of U.S. provisional application Ser. No. 62/571,833, filed Oct. 13, 2017, the subject matter of which is incorporated herein by reference.

FIELD OF THE INVENTION

The present invention relates to a random code generator and an associated control method, and more particularly to a random code generator with differential cells and an associated control method.

BACKGROUND OF THE INVENTION

As is well known, a non-volatile memory is able to continuously retain data after the supplied power is interrupted. Generally, after the non-volatile memory leaves the factory, the user may program the non-volatile memory in order to record data into the memory cells of the non-volatile memory.

FIG. 1A is a schematic circuit diagram illustrating a conventional floating gate type differential cell. FIG. 1B is a bias voltage table illustrating the bias voltages for programming and reading the conventional floating gate type differential cell of FIG. 1A. The floating gate type differential cell 10 comprises two sub-cells 12 and 14. The sub-cells 12 and 14 have the same structure.

The floating gate type differential cell 10 has four nodes a1, a2, a3 and a4. The node a1 is connected with a source control line CLs. The node a2 is connected with a word line WL. The node a3 is connected with a first bit line BL1. The node a4 is connected with a second bit line BL2. The source terminal of a first select transistor ms1 and the source terminal of a second select transistor ms2 are connected with the node a1. The gate terminal of the first select transistor ms1 and the gate terminal of the second select transistor ms2 are connected with the node a2. The drain terminal of a first floating gate transistor mf1 is connected with the node a3. The gate terminal of the first floating gate transistor mf1 is in a floating state. The source terminal of the first floating gate transistor mf1 is connected with the drain terminal of the first select transistor ms1. The drain terminal of a second floating gate transistor mf2 is connected with the node a4. The gate terminal of the second floating gate transistor mf2 is in the floating state. The source terminal of the second floating gate transistor mf2 is connected with the drain terminal of the second select transistor ms2.

During a program cycle (PGM), the two sub-cells 12 and 14 of the floating gate type differential cell 10 have to be programmed to different states. Please refer to FIG. 1B. During the program cycle, a select voltage Vsel such as a ground voltage (0V) is provided to the word line WL and the first bit line BL1, and a program voltage Vpp is provided to the source control line CLs and the second bit line BL2. Consequently, the first select transistor ms1 and the second select transistor ms2 are turned on. Under this circumstance, the sub-cell 12 generates a program current but the sub-cell 14 does not generate the program current. Since hot carriers are injected into the floating gate of the first floating gate transistor mf1, the sub-cell 12 is programmed to an on state. Since no hot carriers are injected into the floating gate of the second floating gate transistor mf2, the sub-cell 14 is programmed to an off state. In case that the sub-cell 12 is in the on state and the sub-cell 14 is in the off state, the floating gate type differential cell 10 is programmed to a first storage state.

The bias voltages for programming the floating gate type differential cell 10 to the first storage state are not restricted. For example, in case that the program voltage Vpp is provided to the source control line CLs, the ground voltage (0V) is provided to the word line WL and the first bit line BL1 and the second bit line BL2 is in the floating state, the floating gate type differential cell 10 is also programmed to the first storage state.

Please refer to FIG. 1B again. During the program cycle, the select voltage Vsel is provided to the word line WL and the second bit line BL2, and the program voltage Vpp is provided to the source control line CLs and the first bit line BL1. Consequently, the first select transistor ms1 and the second select transistor ms2 are turned on. Under this circumstance, the sub-cell 14 generates a program current but the sub-cell 12 does not generate the program current. Since hot carriers are injected into the floating gate of the second floating gate transistor mf2, the sub-cell 14 is programmed to an on state. Since no hot carriers are injected into the floating gate of the first floating gate transistor mf1, the sub-cell 12 is programmed to an off state. In case that the sub-cell 12 is in the off state and the sub-cell 14 is in the on state, the floating gate type differential cell 10 is programmed to a second storage state.

The bias voltages for programming the floating gate type differential cell 10 to the second storage state are not restricted. For example, in case that the program voltage Vpp is provided to the source control line CLs, the ground voltage (0V) is provided to the word line WL and the second bit line BL2 and the first bit line BL1 is in the floating state, the floating gate type differential cell 10 is also programmed to the second storage state.

During a read cycle (READ), the select voltage Vsel is provided to the word line WL, the first bit line BL1 and the second bit line BL2, and a read voltage Vr is provided to the source control line CLs. In case that the floating gate type differential cell 10 is in the first storage state, the read current outputted from the sub-cell 12 to the first bit line BL1 is higher, and the read current outputted from the sub-cell 14 to the second bit line BL2 is lower (i.e., nearly zero). Whereas, in case that the floating gate type differential cell 10 is in the second storage state, the read current outputted from the sub-cell 12 to the first bit line BL1 is lower (i.e., nearly zero), and the read current outputted from the sub-cell 14 to the second bit line BL2 is higher.

In other words, the storage state of the floating gate type differential cell 10 is judged according to the magnitudes of the read currents in the first bit line BL1 and the second bit line BL2 during the read cycle.

As shown in FIG. 1A, each of the two sub-cells 12 and 14 comprises two transistors. It is noted that the number of the transistors in the sub-cell is not restricted. For example, each sub-cell further comprises a following transistor between the select transistor and the floating gate transistor. The gate terminal of the following transistor is connected with a following gate line. The source terminal of the following transistor is connected with the drain terminal of the select transistor. The drain terminal of the following transistor is connected with the source terminal of the floating gate transistor.

The transistors of the sub-cells 12 and 14 are p-type transistors. It is noted that n-type transistors may be used to construct the sub-cells and form the floating gate type differential cell.

FIG. 2A is a schematic circuit diagram illustrating a conventional antifuse differential cell. FIG. 2B is a bias voltage table illustrating the bias voltages for programming and reading the conventional antifuse differential cell of FIG. 2A. The antifuse differential cell 20 comprises two sub-cells 22 and 24. The sub-cells 22 and 24 have the same structure.

The antifuse differential cell 20 has four nodes b1, b2, b3 and b4. The node b1 is connected with an antifuse control line CLaf. The node b2 is connected with a word line WL. The node b3 is connected with a first bit line BL1. The node b4 is connected with a second bit line BL2. The source terminal of a first select transistor Ms1 is connected with the node b3. The gate terminal of the first select transistor Ms1 is connected with the node b2. The source terminal of a second select transistor Ms2 is connected with the node b4. The gate terminal of the second select transistor Ms2 is connected with the node b2. The drain terminal of a first antifuse transistor Ma1 is in a floating state. The source terminal of the first antifuse transistor Ma1 is connected with the drain terminal of the first select transistor Ms1. The gate terminal of the first antifuse transistor Ma1 is connected with the node b1.

The drain terminal of a second antifuse transistor Ma2 is in the floating state. The source terminal of the second antifuse transistor Ma2 is connected with the drain terminal of the second select transistor Ms2. The gate terminal of the second antifuse transistor Ma2 is connected with the node b1.

During a program cycle (PGM), the two sub-cells 22 and 24 of the antifuse differential cell 20 have to be programmed to different states. Please refer to FIG. 2B. During the program cycle, a select voltage Vsel (e.g., 3.3V) is provided to the word line WL, a program voltage Vpp is provided to the antifuse control line CLaf and the second bit line BL2, and a ground voltage (e.g., 0V) is provided to the first bit line BL1. Consequently, the first select transistor Ms1 and the second select transistor Ms2 are turned on. Under this circumstance, the sub-cell 22 generates a program current, but the sub-cell 24 does not generate the program current. Since the gate oxide layer of the first antifuse transistor Ma1 is ruptured, the sub-cell 22 is programmed to a low-resistance state (i.e., an on state). Since the gate oxide layer of the second antifuse transistor Ma2 is not ruptured, the sub-cell 24 is programmed to a high-resistance state (i.e., an off state). In case that the sub-cell 22 is in the on state and the sub-cell 24 is in the off state, the antifuse differential cell 20 is programmed to a first storage state.

The bias voltages for programming the antifuse differential cell 20 to the first storage state are not restricted. For example, in case that the program voltage Vpp is provided to the antifuse control line CLaf, the select voltage Vsel is provided to the word line WL, the ground voltage (0V) is provided to the first bit line BL1 and the second bit line BL2 is in the floating state, the antifuse differential cell 20 is also programmed to the first storage state.

Please refer to FIG. 2B again. During the program cycle, the select voltage Vsel is provided to the word line WL, the program voltage Vpp is provided to the antifuse control line CLaf and the first bit line BL1, and the ground voltage (e.g., 0V) is provided to the second bit line BL2. Consequently, the first select transistor Ms1 and the second select transistor Ms2 are turned on. Under this circumstance, the sub-cell 24 generates a program current, but the sub-cell 22 does not generate the program current. Since the gate oxide layer of the second antifuse transistor Ma2 is ruptured, the sub-cell 24 is programmed to a low-resistance state (i.e., an on state). Since the gate oxide layer of the first antifuse transistor Ma1 is not ruptured, the sub-cell 22 is programmed to a high-resistance state (i.e., an off state). In case that the sub-cell 24 is in the on state and the sub-cell 22 is in the off state, the antifuse differential cell 20 is programmed to a second storage state.

The bias voltages for programming the antifuse differential cell 20 to the second storage state are not restricted. For example, in case that the program voltage Vpp is provided to the antifuse control line CLaf, the select voltage Vsel is provided to the word line WL, the ground voltage (0V) is provided to the second bit line BL2 and the first bit line BL1 is in the floating state, the antifuse differential cell 20 is also programmed to the second storage state.

During a read cycle (READ), the select voltage Vsel is provided to the word line WL, the ground voltage (0V) is provided to the first bit line BL1 and the second bit line BL2, and a read voltage Vr is provided to the antifuse control line CLaf. In case that the antifuse differential cell 20 is in the first storage state, the read current outputted from the sub-cell 22 to the first bit line BL1 is higher, and the read current outputted from the sub-cell 24 to the second bit line BL2 is lower (i.e., nearly zero). Whereas, in case that the antifuse differential cell 20 is in the second storage state, the read current outputted from the sub-cell 22 to the first bit line BL1 is lower (i.e., nearly zero), and the read current outputted from the sub-cell 24 to the second bit line BL2 is higher.

In other words, the storage state of the antifuse differential cell 20 is judged according to the magnitudes of the read currents in the first bit line BL1 and the second bit line BL2 during the read cycle.

As shown in FIG. 2A, each of the two sub-cells 22 and 24 comprises two transistors. It is noted that the number of the transistors in the sub-cell is not restricted. For example, each sub-cell further comprises a following transistor between the select transistor and the floating gate transistor. The gate terminal of the following transistor is connected with a following gate line. The source terminal of the following transistor is connected with the drain terminal of the select transistor. The drain terminal of the following transistor is connected with the source terminal of the antifuse transistor.

The transistors of the sub-cells 22 and 24 are n-type transistors. It is noted that p-type transistors may be used to construct the sub-cells and form the antifuse differential cell.

FIG. 3A is a schematic circuit diagram illustrating a conventional antifuse differential cell for generating a random code. FIG. 3B is a bias voltage table illustrating the bias voltages for programming and reading the conventional antifuse differential cell of FIG. 3A. The antifuse differential cell is disclosed in U.S. Pat. No. 9,613,714.

As shown in FIG. 3A, the antifuse differential cell c1 comprises a sub-cell 32, a sub-cell 34 and an isolation transistor O. The sub-cell 32 comprises a first select transistor S1 and a first antifuse transistor A1. The sub-cell 34 comprises a second select transistor S2 and a second antifuse transistor A2.

The first select transistor S1, the first antifuse transistor A1, the isolation transistor O, the second antifuse transistor A2 and the second select transistor S2 of the antifuse differential cell c1 are serially connected between a first bit line BL1 and a second bit line BL2. The gate terminal of the first select transistor S1 is connected with a word line WL. The gate terminal of the first antifuse transistor A1 is connected with a first antifuse control line AF1. The gate terminal of the isolation transistor O is connected with an isolation control line IG. The gate terminal of the second antifuse transistor A2 is connected with a second antifuse control line AF2. The gate terminal of the second select transistor S2 is connected with the word line WL.

Please refer to FIG. 3B. During a program cycle (PGM), a ground voltage (0V) is provided to the first bit line BL1 and the second bit line BL2, a select voltage Vdd is provided to the word line WL, a program voltage Vpp is provided to the first antifuse control line AF1 and the second antifuse control line AF2, and an on voltage Von is provided to the isolation control line IG.

During the program cycle, all of the first select transistor S1, the second select transistor S2 and the isolation transistor O are turned on and the state of one of the first antifuse transistor A1 and the second antifuse transistor A2 is changed. For example, the first antifuse transistor A1 of the sub-cell 32 is changed to the low-resistance on state, but the second antifuse transistor A2 of the sub-cell 34 is maintained in the high-resistance off state. Alternatively, the second antifuse transistor A2 of the sub-cell 34 is changed to the low-resistance on state, but the first antifuse transistor A1 of the sub-cell 32 is maintained in the high-resistance off state.

During a read cycle (READ), the ground voltage (0V) is provided to the first bit line BL1 and the second bit line BL2, the select voltage Vdd is provided to the word line WL, a read voltage Vr is provided to the first antifuse control line AF1 and the second antifuse control line AF2, and an off voltage Voff is provided to the isolation control line IG.

During the read cycle, the first select transistor S1 and the second select transistor S2 are turned on, and the isolation transistor O is turned off. The first antifuse transistor A1 and the second antifuse transistor A2 generate read currents to the first bit line BL1 and the second bit line BL2, respectively. Generally, the read current generated by the sub-cell in the low-resistance on state is higher, and the read current generated by the sub-cell in the high-resistance off state is lower. For example, the read c the sub-cell in the low-resistance on state the antifuse transistor with the low-resistance state is 10 µA, and the read current generated by the sub-cell in the high-resistance off state is 0.1 µA.

Moreover, during the read cycle, a sensing circuit (not shown) determines the storage state of the antifuse differential cell c1 according to the magnitudes of the read currents from first antifuse transistor A1 and the second antifuse transistor A2. In case that the read current generated by the sub-cell 32 is higher and the read current generated by the sub-cell 34 is lower, the antifuse differential cell c1 is judged to have a first storage state. In case that the read current generated by the sub-cell 32 is lower and the read current generated by the sub-cell 34 is higher, the antifuse differential cell c1 is judged to have a second storage state.

Due to the process variations of the antifuse transistors A1 and A2, it is unable to realize which of the antifuse transistors A1 and A2 has the changed state during the program cycle. After the antifuse differential cell c1 is programmed, the storage state of the antifuse differential cell c1 is used as a bit of a random code.

Moreover, plural antifuse differential cells are collaboratively formed as a differential cell array. After the differential cell array is programmed, a random code is determined according to the storage sates of the plural antifuse differential cells. For example, after eight antifuse differential cells are programmed, the eight storage states of the eight programmed antifuse differential cells indicate a one-byte random code.

Moreover, some antifuse differential cells with different structures are disclosed in U.S. Pat. No. 9,613,714. Each of these antifuse differential cells generates one bit of the random code according to the process variations of two antifuse transistors.

During the program cycle (PGM), the program voltage Vpp is provided to the first antifuse control line AF1 and the second antifuse control line AF2. Ideally, during the program cycle of the antifuse differential cell, the gate oxide layer of only one antifuse transistor is ruptured and the state is changed. Whereas, the gate oxide layer of the other antifuse transistor is not ruptured, and the state is not changed.

Since the program voltage Vpp is continuously provided to the first antifuse control line AF1 and the second antifuse control line AF2, some problems occur. In few situations, the gate oxide layers of the two antifuse transistors are ruptured during the program cycle of the antifuse differential cell. Correspondingly, during the read cycle, the read currents generated by the two antifuse transistors of the antifuse differential cell are very large. Since the sensing circuit is unable to accurately judge the storage state of the antifuse differential cell, the random code cannot be accurately generated.

SUMMARY OF THE INVENTION

An embodiment of the present invention provides a random code generator. The random code generator includes a power circuit, a differential cell array, a voltage detector, a read/write circuit and a control circuit. The power circuit provides a supply voltage to a node. The differential cell array includes plural differential cells. Each differential cell includes two sub-cells. A first terminal of the differential cell array is connected with a control line. A second terminal of the differential cell array is connected with a word line. A third terminal of the differential cell array is connected with a first bit line. A fourth terminal of the differential cell array is connected with a second bit line. The voltage detector is connected with the node for detecting a node voltage of the node. The read/write circuit is connected with the first bit line and the second bit line. The control circuit is connected with the word line, the power circuit, the voltage detector and the read/write circuit. During enrollment, the power circuit provides the supply voltage to the control line, the read/write circuit provides a ground voltage to the first bit line and the second bit line, and the control circuit provides a select voltage to the word line to enroll a selected differential cell of the differential cell array. Consequently, one of the two sub-cells is programmed to an on state, and the other of the two sub-cells is subjected to a program inhibition and in an off state. The read/write circuit judges a storage state of the selected differential cell and determines a bit of a random code according to the storage state of the selected differential cell.

Another embodiment of the present invention provides a control method for a random code generator. The random code generator includes a differential cell array, a capacitor, a voltage detector, a read/write circuit and a control circuit. The differential cell array includes plural differential cells. Each differential cell includes two sub-cells. A first terminal of the differential cell array is connected with a control line. A second terminal of the differential cell array is connected with a word line. A third terminal of the differential cell array is connected with a first bit line. A fourth terminal of the differential cell array is connected with a second bit line. The capacitor is connected with a node. The node is connected with the control line. The voltage detector is connected with the node for detecting a node voltage of the node. The read/write circuit is connected with the first bit line and the second bit line. The control circuit is connected with the word line, the voltage detector and the read/write circuit. The control method includes the following steps. In a step (a), the capacitor is charged to a supply voltage. In a step (b), a selected differential cell of the differential cell array is enrolled according to the supply voltage of the capacitor. In a step (c), if the node voltage of the node is lower than a predetermined voltage, the read/write circuit judges a storage state of the selected differential cell and determines a bit of a random code according to the storage state of the selected differential cell.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4 is a bias voltage table illustrating the bias voltages for enrolling and reading the differential cell according to an embodiment of the present invention;

FIG. 5A is a schematic circuit diagram illustrating a random code generator with differential cells according to a first embodiment of the present invention;

DETAILED DESCRIPTION OF PREFERRED EMBODIMENTS

Figures 1A, 1B:
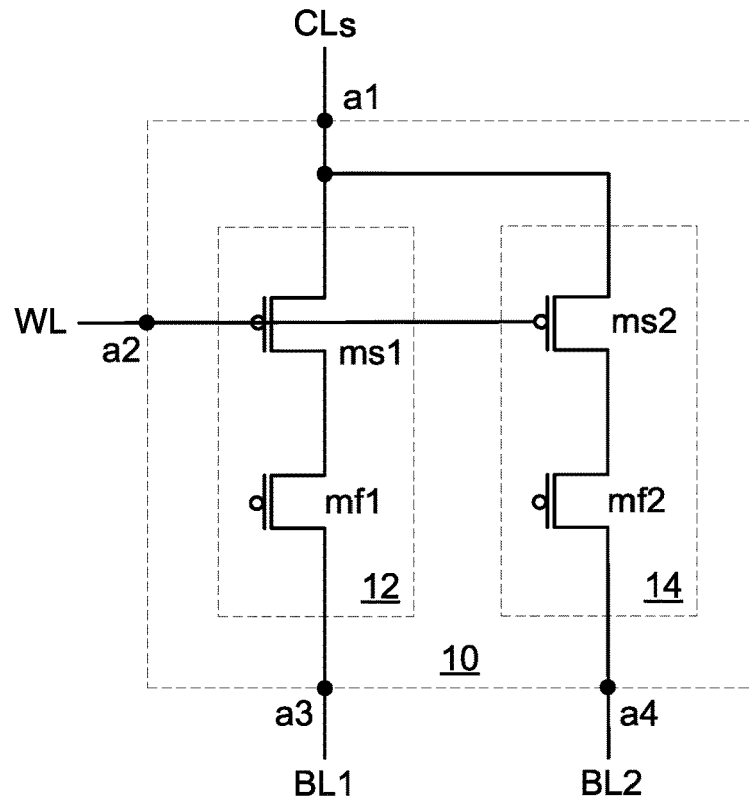
FIG. 1A (prior art) is a schematic circuit diagram illustrating a conventional floating gate type differential cell.
FIG. 1B (prior art) is a bias voltage table illustrating the bias voltages for programming and reading the conventional floating gate type differential cell of FIG. 1A.

Generally, during the process of manufacturing the non-volatile memory, the non-volatile memory is subjected to the process variation. That is, after the differential cell of FIG. 1A or FIG. 2A has been manufactured, the structures of the two sub-cells are certainly different.

According to the process variations of the differential cell, the present invention provides a random code generator. The differential cell of the random code generator is enrolled according to specified bias voltages. After the enrollment of the differential cell is completed, a program action is performed on one of the two sub-cells, and a program inhibition is performed on the other of the two sub-cells.

FIG. 4 is a bias voltage table illustrating the bias voltages for enrolling and reading the differential cell according to an embodiment of the present invention. The bias voltages as shown in FIG. 4 may be used to enroll the floating gate type differential cell of FIG. 1A and the antifuse differential cell of FIG. 2A. The bias voltages for reading the differential cell are identical to those of FIG. 1B and FIG. 2B, and are not redundantly described herein.

During the enrollment of the differential cell, a select voltage Vsel is provided to a word line WL, a ground voltage (e.g., 0V) is provided to a first bit line BL1 and a second bit line BL2, and a program voltage Vpp is provided to a control line CL. The control line CL is a source control line CLs or an antifuse control line CLaf.

Due to the process variations of the differential cell, it is unable to realize which of the sub-cells has the changed state during the enrollment. Consequently, after the differential cell is enrolled, the storage state of the differential cell is used as a bit of a random code.

A process of enrolling the floating gate type differential cell 10 of FIG. 1A will be described as follows. During the enrollment, the select voltage Vsel (e.g., 0V) is provided to the word line WL, the ground voltage (e.g., 0V) is provided to the first bit line BL1 and the second bit line BL2, and the program voltage Vpp is provided to the source control line CLs. Consequently, the program voltage Vpp is received by the first floating gate transistor mf1 of the sub-cell 12 and the second floating gate transistor mf2 of the sub-cell 14 simultaneously.

As mentioned above, the two sub-cells 12 and 14 of the floating gate type differential cell 10 have process variations. Consequently, after the enrollment of the differential cell is completed, a program action is performed on one sub-cell, and a program inhibition is performed on the other sub-cell. In case that the program action is performed on the sub-cell 12 during the enrollment, the program inhibition is performed on the sub-cell 14. Since hot carriers are injected into the floating gate of the first floating gate transistor mf1, the sub-cell 12 is in an on state. Since no hot carriers are injected into the floating gate of the second floating gate transistor mf2, the sub-cell 14 is in an off state. In case that the sub-cell 12 is in the on state and the sub-cell 14 is in the off state, the floating gate type differential cell 10 is enrolled to a first storage state.

A process of enrolling the antifuse differential cell 20 of FIG. 2A will be described as follows. During the enrollment, the select voltage Vsel (e.g., 3.3V) is provided to the word line WL, the ground voltage (e.g., 0V) is provided to the first bit line BL1 and the second bit line BL2, and the program voltage Vpp is provided to the antifuse control line CLaf. Consequently, the program voltage Vpp is received by the first antifuse transistor Ma1 of the sub-cell 22 and the second antifuse transistor Ma2 of the sub-cell 24 simultaneously.

As mentioned above, the two sub-cells 22 and 24 of the antifuse differential cell 20 have process variations. Consequently, after the enrollment of the differential cell is completed, a program action is performed on one sub-cell, and a program inhibition is performed on the other sub-cell. In case that the program action is performed on the sub-cell 22 during the enrollment, the program inhibition is performed on the sub-cell 24. Since the gate oxide layer of the first antifuse transistor Ma1 is ruptured, the sub-cell 22 is in a low-resistance state (i.e., an on state). Since the gate oxide layer of the second antifuse transistor Ma2 is not ruptured, the sub-cell 24 is in a high-resistance state (i.e., an off state). In case that the sub-cell 22 is in the on state and the sub-cell 24 is in the off state, the antifuse differential cell 20 is enrolled to a first storage state.

FIG. 5A is a schematic circuit diagram illustrating a random code generator with differential cells according to a first embodiment of the present invention. As shown in FIG. 5A, the random code generator comprises a power circuit 403, a voltage detector 410, a control circuit 420, a differential cell array 430 and a read/write circuit 440.

The power circuit 403 comprises a voltage source 401 and a charging circuit 405. The charging circuit 405 comprises a switch SW and a capacitor C. A first terminal of the switch SW receives a supply voltage Vs from the voltage source 401. A second terminal of the switch SW is connected with a node A. The capacitor C is connected between the node A and a ground terminal. Moreover, the operation of the switch SW is controlled according to a switch control signal SWctrl.

The voltage detector 410 is connected with the node A to detect the voltage of the node A and generate a notification signal n to the control circuit 420.

The control circuit 420 is connected with the voltage detector 410, the charging circuit 405 of the power circuit 403, the differential cell array 430 and the read/write circuit 440. The control circuit 420 receives the notification signal n. Moreover, the control circuit 420 issues the switch control signal SWctrl to control the operation of the switch SW. The control circuit 420 issues the select voltage Vsel to the differential cell array 430 through the word line WL in order to determine a selected differential cell from the differential cell array 430. The control circuit 420 also generates a sensing control signal SActrl to control the operation of the read/write circuit 440.

A first terminal z1 of the differential cell array 430 is connected with the control line CL. The control line CL is also connected with the node A. A second terminal z2 of the differential cell array 430 is connected with the word line WL. A third terminal z3 of the differential cell array 430 is connected with the first bit line BL1. A fourth terminal z4 of the differential cell array 430 is connected with the second bit line BL2. The differential cell array 430 comprises plural differential cells. Each differential cell comprises two sub-cells.

In case that the differential cell array 430 comprises plural floating gate type differential cells, each floating gate type differential cell comprises two sub-cells and the structure of the floating gate type differential cell is similar to that of FIG. 1A. In case that the differential cell array 430 comprises plural antifuse differential cells, each antifuse differential cell comprises two sub-cells and the structure of the antifuse differential cell is similar to that of FIG. 2A. It is noted that the structures of the sub-cells of the differential cells are not restricted.

For example, in a variant example of the floating gate type differential cell, each sub-cell comprises plural parallel-connected select transistors and plural parallel-connected floating gate transistors. In each sub-cell, the number and type of the select transistor are identical to the number and type of the floating gate transistors. Similarly, in a variant example of the antifuse differential cell, each sub-cell comprises plural parallel-connected select transistors and plural parallel-connected antifuse transistors. In each sub-cell, the number and type of the select transistor are identical to the number and type of the antifuse transistors.

The read/write circuit 440 is connected with the control circuit 420, the first bit line BL1 and the second bit line BL2. When the read/write circuit 440 receives the sensing control signal SActrl, the read/write circuit 440 is enabled. Moreover, the read/write circuit 440 determines the storage state of the selected differential cell according to the signals of the first bit line BL1 and the second bit line BL2. In addition, the storage state of the selected differential cell is used as one bit of the random code.

In this embodiment, the capacitor C provides the supply voltage Vs to the control line CL during the enrollment of the random code generator. As mentioned above, the two sub-cells of the selected antifuse differential cell have process variations. Consequently, after the enrollment of the selected differential cell is completed, a program action is performed on one sub-cell, and a program inhibition is performed on the other sub-cell. Regardless of which sub-cell is programmed, the program current results in the voltage decline of the capacitor C. Consequently, the program inhibition is performed on the other sub-cell. In such way, only one sub-cell of the selected differential cell is programmed.

Figure 5B:
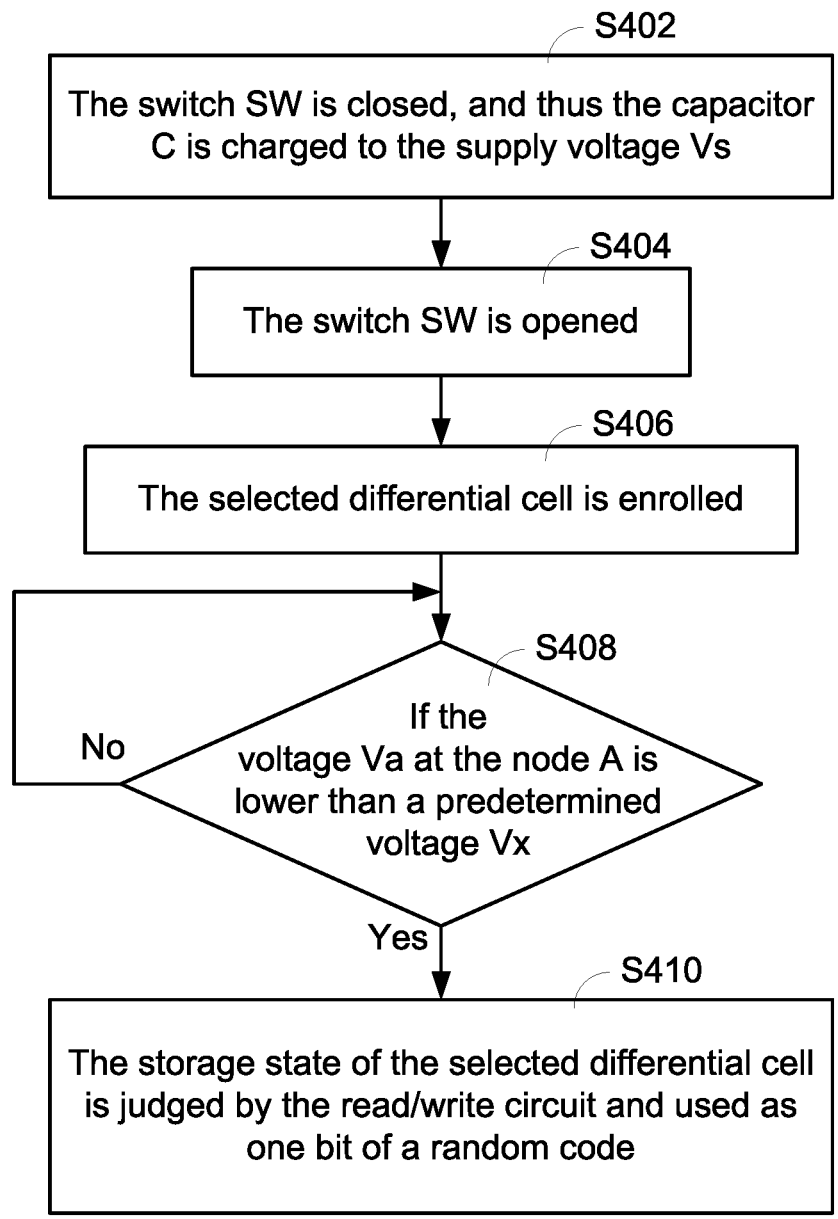
FIG. 5B is a flowchart of a control method for the random code generator according to the first embodiment of the present invention.

FIG. 5B is a flowchart of a control method for the random code generator according to the first embodiment of the present invention. Before the enrollment, the control circuit 420 issues the switch control signal SWctrl to close the switch SW. Consequently, the capacitor C is charged to the supply voltage Vs (Step 402). Then, the control circuit 420 issues the switch control signal SWctrl to open the switch SW (Step S404). In the step S402, the switch SW is closed for a short time period (e.g., 1 μs~10 μs) by the control circuit 420, so that the capacitor C is charged to the supply voltage Vs. Then, the switch SW is opened by the control circuit 420. That is, the supply voltage Vs is the program voltage Vpp.

Then, the selected differential cell is enrolled (Step S406). Generally, the capacitor C provides the supply voltage Vs to the control line CL, the control circuit 420 provides the select voltage Vsel to the line WL, and the control circuit 420 controls the read/write circuit 440 to provide the ground voltage (0V) to the first bit line BL1 and the second bit line BL2. Then, the supply voltage Vs (i.e., the program voltage Vpp) is received by the two sub-cells of the selected differential cell simultaneously. Obviously, the capacitor C cannot provide the stable supply voltage Vs continuously. When the program action is performed on one sub-cell of the selected differential cell, the program inhibition is performed on the other sub-cell because the program current results in the voltage decline of the capacitor C.

Take the floating gate type differential cell 10 of FIG. 1A for example. Due to the process variations, one sub-cell is programmed to take a greater portion of the current from the capacitor C during the enrollment. The program inhibition is performed on the other sub-cell because of the insufficient current. For example, if the sub-cell 14 is programmed faster during the enrollment, hot carriers are injected into the floating gate of the second floating gate transistor mf2 and the sub-cell 14 is in the on state. Since the current is insufficient and hot carriers are not injected into the floating gate of the first floating gate transistor mf1, the sub-cell 12 is in the off state. In case that the sub-cell 14 is in the on state and the sub-cell 12 is in the off state, the floating gate type differential cell 10 is enrolled to a second storage state.

Figures 2A, 2B:
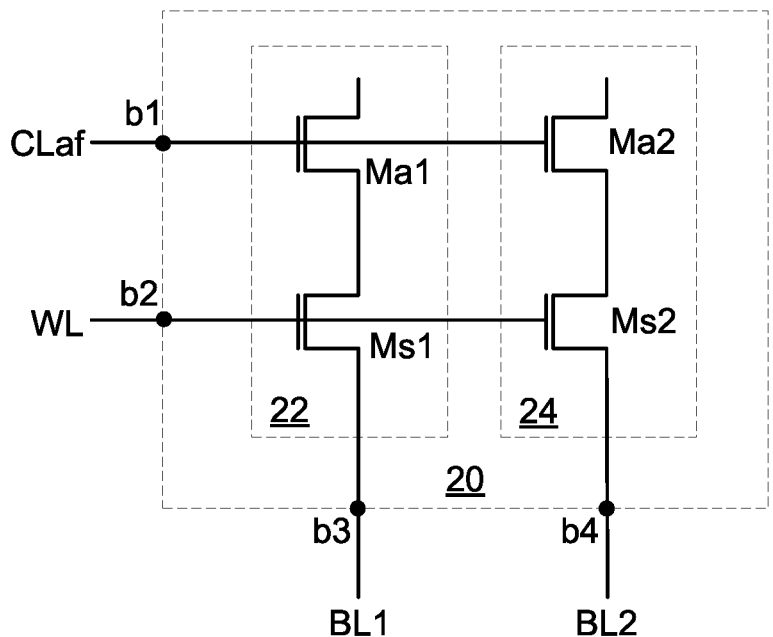
FIG. 2A (prior art) is a schematic circuit diagram illustrating a conventional antifuse differential cell.
FIG. 2B (prior art) is a bias voltage table illustrating the bias voltages for programming and reading the conventional antifuse differential cell of FIG. 2A.
Figures 3A, 3B:
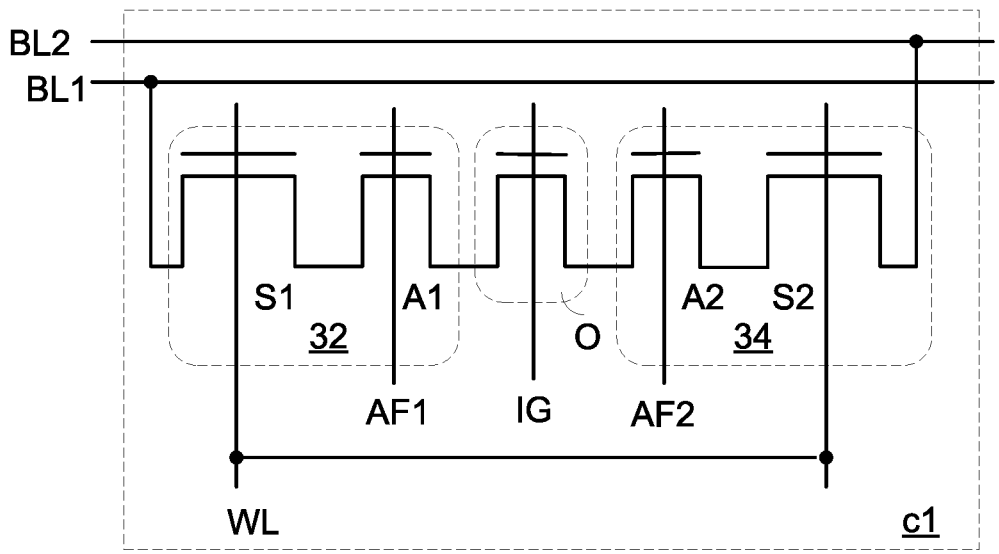
FIG. 3A (prior art) is a schematic circuit diagram illustrating a conventional antifuse differential cell for generating a random code.
FIG. 3B (prior art) is a bias voltage table illustrating the bias voltages for programming and reading the conventional antifuse differential cell of FIG. 3A.

Take the antifuse differential cell 20 of FIG. 2A for example. Due to the process variations, one sub-cell is programmed to take a greater portion of the current from the capacitor C during the enrollment. The program inhibition is performed on the other sub-cell because of the insufficient current. For example, if the sub-cell 24 generates the program current earlier during the enrollment, the gate oxide layer of the second antifuse transistor Ma2 is ruptured and the sub-cell 24 is in the low-resistance state (i.e., the on state). Since the sub-cell 22 generates the program current later and the program inhibition is performed, the gate oxide layer of the first antifuse transistor Ma1 is not ruptured, the sub-cell 22 is in the high-resistance state (i.e., the off state). In case that the sub-cell 24 is in the on state and the sub-cell 22 is in the off state, the antifuse differential cell 20 is enrolled to a second storage state.

Moreover, the voltage Va at the node A is detected by the voltage detector 410 during the enrollment. If the voltage Va at the node A is lower than a predetermined voltage Vx (Step S408), the storage state of the selected differential cell is judged by the read/write circuit 440 and used as one bit of a random code (Step S410). When the voltage detector 410 judges that the voltage Va at the node A is lower than the predetermined voltage Vx, it means that one sub-cell of the selected differential cell has been programmed and the program inhibition is performed on the other sub-cell. Meanwhile, the voltage detector 410 issues the notification signal n to the control circuit 420. The control circuit 420 generates the sensing control signal SActrl to control the operation of the read/write circuit 440. The read/write circuit 440 determines the storage state of the selected differential cell according to the signals of the first bit line BL1 and the second bit line BL2. In addition, the storage state of the selected differential cell is used as one bit of the random code.

As mentioned above, the capacitor C of the charging circuit 405 provides the supply voltage Vs. During the enrollment, the capacitor C provides the supply voltage Vs to the control line CL. Regardless of which sub-cell is programmed, the program current results in the voltage decline of the capacitor C. Consequently, the program inhibition is performed on the other sub-cell. In such way, only one sub-cell of the selected differential cell is programmed, and the two sub-cells are not simultaneously programmed.

However, during the enrollment, the leakage current of the differential cell array 430 may result in the voltage decline of the capacitor C but none of the two sub-cells of the selected differential cell is programmed. For solving the above drawbacks, the control method needs to be further modified.

Figure 5C:
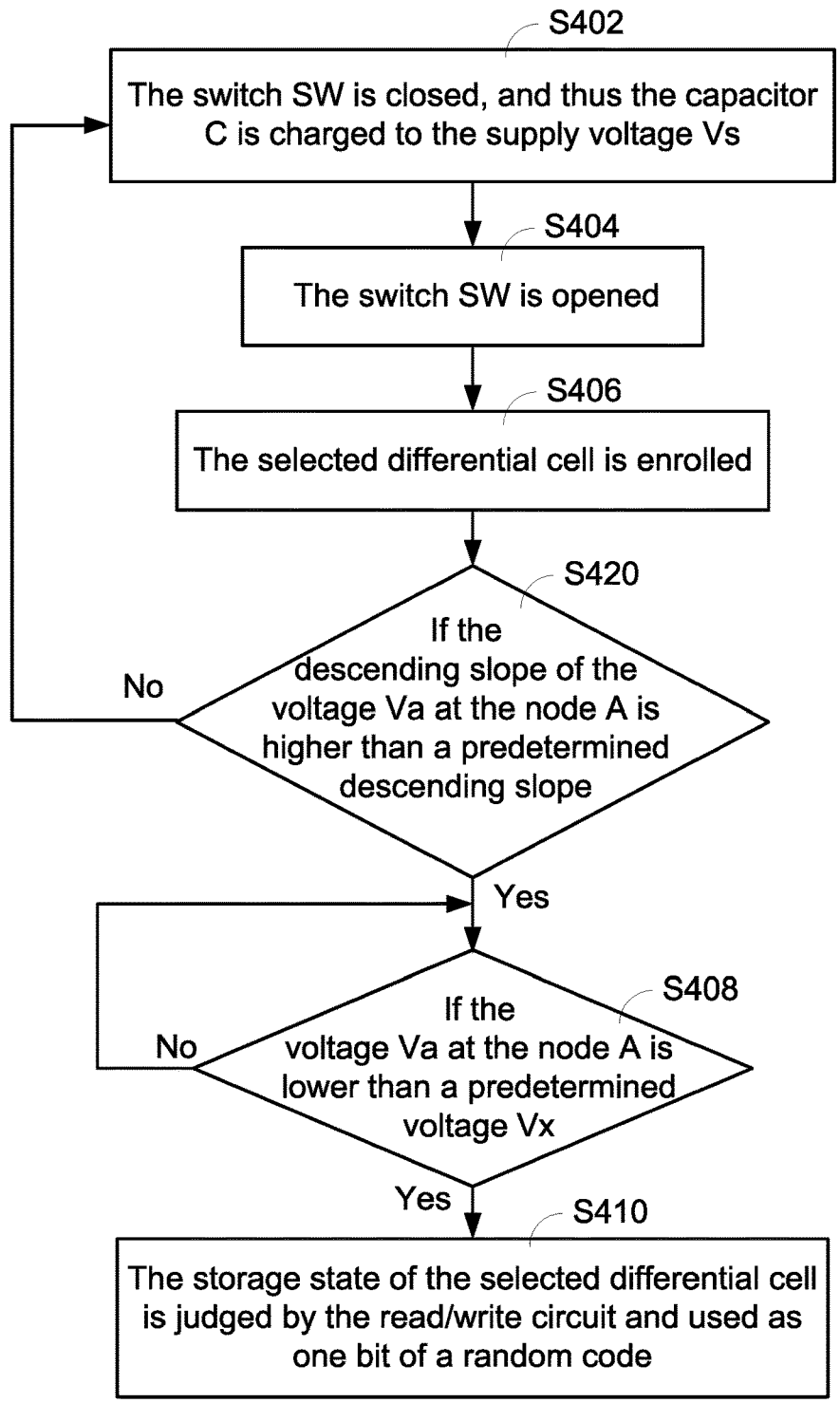
FIG. 5C is a flowchart illustrating a variant example of the control method of FIG. 5B.

FIG. 5C is a flowchart illustrating a variant example of the control method of FIG. 5B. Before the enrollment, the control circuit 420 issues the switch control signal SWctrl to close the switch SW. Consequently, the capacitor C is charged to the supply voltage Vs (Step 402). Then, the control circuit 420 issues the switch control signal SWctrl to open the switch SW (Step S404). In the step S402, the switch SW is closed for a short time period (e.g., 1 μs~10 μs) by the control circuit 420, so that the capacitor C is charged to the supply voltage Vs. Then, the switch SW is opened by the control circuit 420.

Then, the selected differential cell is enrolled (Step S406). Generally, the capacitor C provides the supply voltage Vs to the control line CL, the control circuit 420 provides the select voltage Vsel to the line WL, and the control circuit 420 controls the read/write circuit 440 to provide the ground voltage (0V) to the first bit line BL1 and the second bit line BL2. Then, the supply voltage Vs is received by the two sub-cells of the selected differential cell simultaneously.

Then, the voltage detector 410 judges whether the descending slope of the voltage Va at the node A is higher than a predetermined descending slope (Step S420).

If the leakage current of the differential cell array 430 results in the voltage decline of the capacitor C during the enrollment, the descending slope of the voltage Va at the node A is very low. Meanwhile, it is necessary to provide the supply voltage Vs to the capacitor C.

If the judging result of the step S420 indicates that the descending slope of the voltage Va at the node A is not higher than the predetermined descending slope, the step S402 is repeatedly done. That is, the switch SW is shortly closed and the capacitor C is charged to the supply voltage Vs again.

Whereas, if the judging result of the step S420 indicates that the descending slope of the voltage Va at the node A is higher than the predetermined descending slope, the voltage detector 410 realizes that the leakage current results in the voltage decline of the capacitor C. Then, the voltage detector 410 continuously detects the voltage Va at the node A.

If the voltage Va at the node A is lower than a predetermined voltage Vx (Step S408), the storage state of the selected differential cell is judged by the read/write circuit 440 and used as one bit of a random code (Step S410).

As mentioned above, the descending slope of the voltage Va at the node A is compared with the predetermined descending slope during the enrollment. If the descending slope of the voltage Va at the node A is lower than the predetermined descending slope, the voltage detector 410 issues the notification signal n to the control circuit 420. According to the notification signal, the control circuit 420 closes the switch SW again. Consequently, the voltage of the capacitor C is maintained at the supply voltage Vs. If the descending slope of the voltage Va at the node A is higher than the predetermined descending slope, it means that one sub-cell of the selected differential cell has been programmed and the program inhibition is performed on the other sub-cell.

In the control method of this embodiment, the supply voltage Vs is the program voltage Vpp. It is noted that the magnitude of the supply voltage Vs is not restrictedly fixed.

For example, while the switch SW is first closed, the supply voltage Vs provided by the voltage source 401 is the program voltage Vpp and the capacitor C is charged to the program voltage Vpp. If the judging result of the step S420 indicates that the descending slope of the voltage Va at the node A is lower than the predetermined descending slope, the step S402 is repeatedly done. Meanwhile, the supply voltage Vs provided by the voltage source 401 is equal to the sum of the program voltage Vpp and one increment voltage ΔV. Consequently, when the switch SW is closed again in the step S402, the capacitor C is charged to the sum of the program voltage Vpp and one increment voltage ΔV. Similarly, when the step S402 is performed again, the supply voltage Vs provided by the voltage source 401 is equal to the sum of the program voltage Vpp and two increment voltage ΔV. The rest may be deduced by analogy.

Please refer to FIGS. 5B and 5C again. When the selected differential cell is enrolled in the step S406, the control circuit 420 starts counting an enrolling time period. If the enrolling time period exceeds a predetermined time period, the control circuit 420 judges that the enrollment is completed and performs the step S410 directly.

Figure 6A:
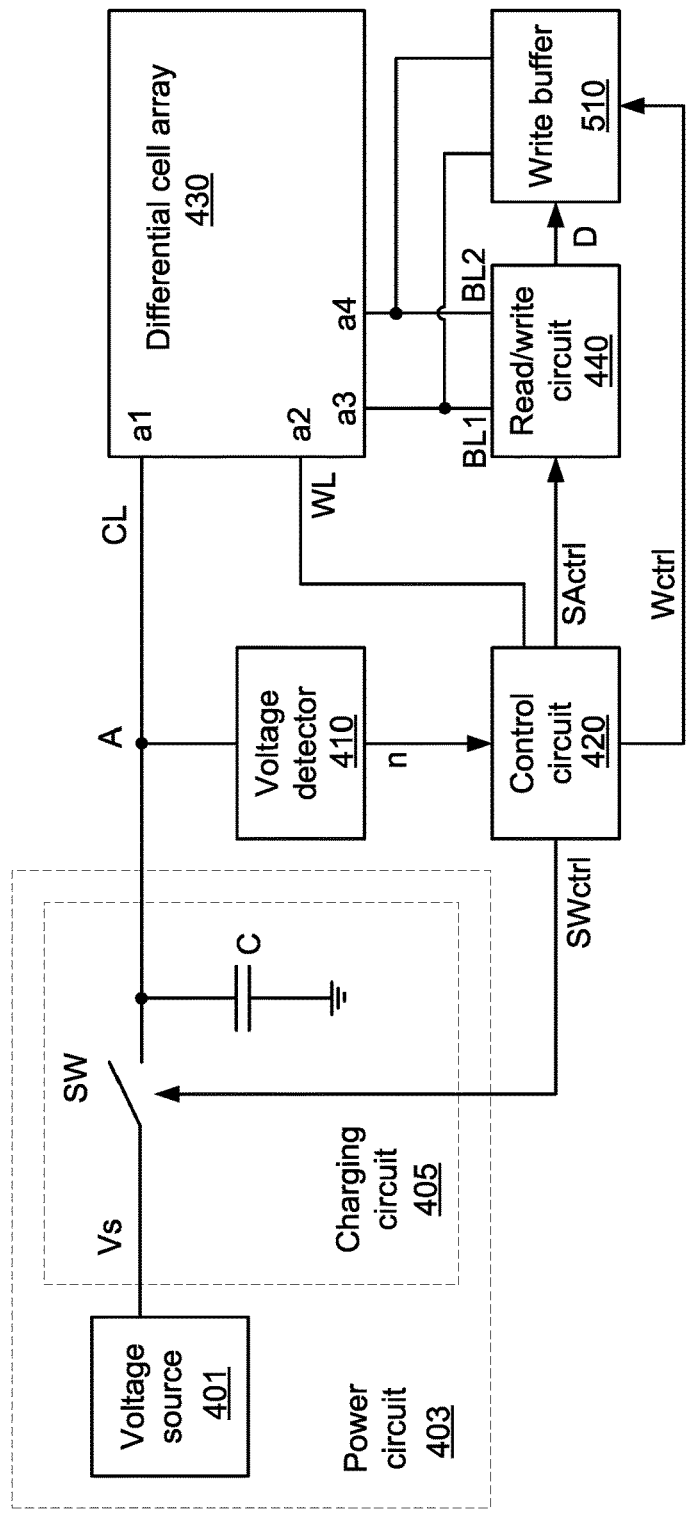
FIG. 6A is a schematic circuit diagram illustrating a random code generator with differential cells according to a second embodiment of the present invention.

FIG. 6A is a schematic circuit diagram illustrating a random code generator with differential cells according to a second embodiment of the present invention. In comparison with the first embodiment, the random code generator of this embodiment further comprises a write buffer 510. The process of programming the selected differential cells of the random code generator of this embodiment is similar to that of the first embodiment, and is not redundantly described herein.

In the second embodiment, the write buffer 510 is connected with the control circuit 420, the read/write circuit 440, the first bit line BL1 and the second bit line BL2. After the read/write circuit 440 recognizes the storage state of the selected differential cell, the read/write circuit 440 issues a data signal D. The control circuit 420 issues a write control signal Wctrl to control the write buffer 510. According to the storage state indicated by the data signal D, the same selected differential cell is programmed again. Consequently, the selected differential cell is in a robust storage state.

For example, if the data signal D from the read/write circuit 440 indicates the first storage state, the control circuit 420 enables a program action. Meanwhile, the select voltage Vsel is provided from the control circuit 420 to the word line WL, the switch SW is closed to provide the stable supply voltage Vs to the control line CL, the ground voltage (e.g., 0V) is provided from the write buffer 510 to the first bit line BL1, and the supply voltage Vs is provided to the second bit line BL2 (or the second bit line BL2 is in the floating state). Consequently, the sub-cell of the selected differential cell connected with the first bit line BL1 is re-programmed to the on state, and the sub-cell of the selected differential cell connected with the second bit line BL2 is re-programmed to the off state.

Similarly, if the data signal D from the read/write circuit 440 indicates the second storage state, the control circuit 420 enables the program action again. Meanwhile, the select voltage Vsel is provided from the control circuit 420 to the word line WL, the switch SW is closed to provide the stable supply voltage Vs to the control line CL, the ground voltage (e.g., 0V) is provided from the write buffer 510 to the second bit line BL2, and the supply voltage Vs is provided to the first bit line BL1 (or the first bit line BL1 is in the floating state). Consequently, the sub-cell of the selected differential cell connected with the first bit line BL1 is re-programmed to the off state, and the sub-cell of the selected differential cell connected with the second bit line BL2 is re-programmed to the on state.

For allowing the selected differential cell to be in the robust storage state, the supply voltage Vs from the voltage source 401 is increased to the sum of the program voltage Vpp and one increment voltage ΔV. Then, the switch SW is closed. Consequently, the stable supply voltage Vs is provided to the control line CL.

Figure 6B:
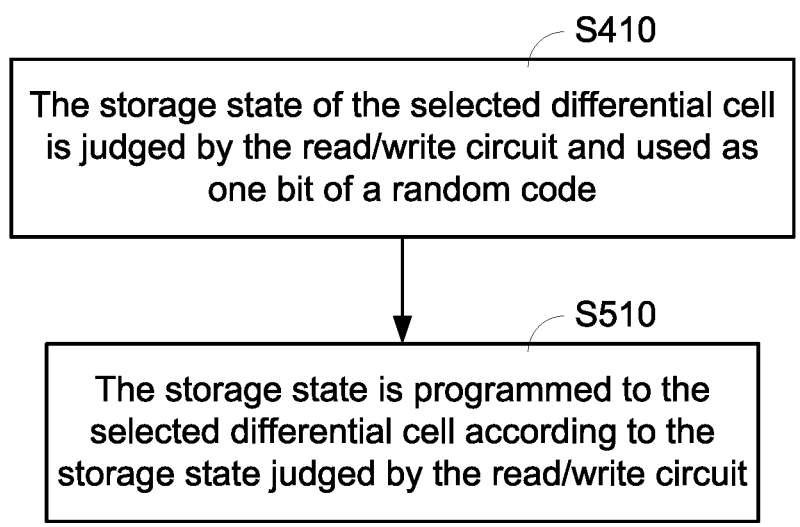
FIG. 6B is a flowchart of a control method for the random code generator according to the second embodiment of the present invention.

FIG. 6B is a flowchart of a control method for the random code generator according to the second embodiment of the present invention. The control method of this embodiment is performed after the step S410 of FIG. 5B or FIG. 5C. After the storage state of the selected differential cell is judged by the read/write circuit 440 and used as one bit of the random code (Step S410), the storage state is programmed from the write buffer 510 to the selected differential cell according to the storage state judged by the read/write circuit 440 (Step S510).

From the above descriptions, the present invention provides a random code generator with differential cells and an associated control method. Firstly, the supply voltage Vs is charged to the capacitor C. During the enrollment, the supply voltage Vs in the capacitor C is provided to the differential cell array. Consequently, only one sub-cell of the differential cell is programmed. After the sub-cell of the differential cell is programmed, the storage state is programmed from the write buffer 510 to the selected differential cell according to the storage state judged by the read/write circuit 440. Consequently, the selected differential cell is in the robust storage state.

In some embodiments, the internal circuitry of the power circuit 403 is properly modified to a limited-current circuit. By the limited-current circuit, the current to be transmitted to the node A is clamped to a preset current range. That is, the program action is performed on one sub-cell of the selected differential cell in response to current from the limited-current circuit, but the program inhibition is performed on the other sub-cell of the selected differential cell.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A random code generator, comprising:
   a power circuit for providing a supply voltage to a node;
   a differential cell array comprising plural differential cells, wherein each differential cell comprises two sub-cells, a first terminal of the differential cell array is connected with the node through a control line, a second terminal of the differential cell array is connected with a word line, a third terminal of the differential cell array is connected with a first bit line, and a fourth terminal of the differential cell array is connected with a second bit line;
   a voltage detector connected with the node for detecting a node voltage of the node;
   a read/write circuit connected with the first bit line and the second bit line; and
   a control circuit connected with the word line, the power circuit, the voltage detector and the read/write circuit,
   wherein during enrollment, the power circuit provides the supply voltage to the control line, the read/write circuit provides a ground voltage to the first bit line and the second bit line, and the control circuit provides a select voltage to the word line to enroll a selected differential cell of the differential cell array, so that one of the two sub-cells is programmed to an on state, and the other of the two sub-cells is subjected to a program inhibition and in an off state,
   wherein the read/write circuit judges a storage state of the selected differential cell and determines a bit of a random code according to the storage state of the selected differential cell.

2. The random code generator as claimed in claim 1, wherein the power circuit comprises:
   a voltage source for outputting the supply voltage; and
   a charging circuit comprising a switch and a capacitor, wherein a first terminal of the switch receives the supply voltage, a second terminal of the switch is connected with the node, the capacitor is connected with the node, and the node is connected with the control line, during the enrollment, the switch is closed for a short time period and then opened, so that the supply voltage is charged to the capacitor and provided to the control line.

3. The random code generator as claimed in claim 2, wherein if a descending slope of the node voltage is not higher than a predetermined descending slope, the switch is closed for a short time period again and then opened, so that the supply voltage is charged to the capacitor again.

4. The random code generator as claimed in claim 1, wherein the power circuit is a limited-current circuit, wherein a current to be transmitted to the node is clamped to a preset current range by the limited-current circuit.

5. The random code generator as claimed in claim 1, wherein the selected differential cell comprises:
- a first sub-cell comprising at least one first select transistor and at least one first floating gate transistor, wherein a source terminal of the at least one first select transistor is connected with the first terminal of the differential cell array, a gate terminal of the at least one first select transistor is connected with the second terminal of the differential cell array, a drain terminal of the at least one first select transistor is connected with a source terminal of the at least one first floating gate transistor, a drain terminal of the at least one first floating gate transistor is connected with the third terminal of the differential cell array, and a gate terminal of the at least one first floating gate transistor is in a floating state; and
- a second sub-cell comprising at least one second select transistor and at least one second floating gate transistor, wherein a source terminal of the at least one second select transistor is connected with the first terminal of the differential cell array, a gate terminal of the at least one second select transistor is connected with the second terminal of the differential cell array, a drain terminal of the at least one second select transistor is connected with a source terminal of the at least one second floating gate transistor, a drain terminal of the at least one second floating gate transistor is connected with the fourth terminal of the differential cell array, and a gate terminal of the at least one second floating gate transistor is in the floating state,
wherein the numbers of the at least one first select transistor and the at least one first floating gate transistor in the first sub-cell and the numbers of the at least one second select transistor and the at least one second floating gate transistor in the second sub-cell are equal.

6. The random code generator as claimed in claim 1, wherein the selected differential cell comprises:
- a first sub-cell comprising at least one first select transistor and at least one first antifuse transistor, wherein a source terminal of the at least one first select transistor is connected with the third terminal of the differential cell array, a gate terminal of the at least one first select transistor is connected with the second terminal of the differential cell array, a drain terminal of the at least one first select transistor is connected with a source terminal of the at least one first antifuse transistor, a gate terminal of the at least one first antifuse transistor is connected with the first terminal of the differential cell array, and a drain terminal of the at least one first antifuse transistor is in a floating state; and
- a second sub-cell comprising at least one second select transistor and at least one second antifuse transistor, wherein a source terminal of the at least one second select transistor is connected with the fourth terminal of the differential cell array, a gate terminal of the at least one second select transistor is connected with the second terminal of the differential cell array, a drain terminal of the at least one second select transistor is connected with a source terminal of the at least one second antifuse transistor, a gate terminal of the at least one second antifuse transistor is connected with the first terminal of the differential cell array, and a drain terminal of the at least one second antifuse transistor is in the floating state,
wherein the numbers of the at least one first select transistor and the at least one first antifuse transistor in the first sub-cell and the numbers of the at least one second select transistor and the at least one second antifuse transistor in the second sub-cell are equal.

7. The random code generator as claimed in claim 1, wherein if the node voltage is lower than a predetermined voltage, the control circuit controls the read/write circuit to judge the storage state of the selected differential cell.

8. The random code generator as claimed in claim 1, wherein the random code generator further comprises a write buffer, and the write buffer is connected with the control circuit, the read/write circuit, the first bit line and the second bit line, wherein after the read/write circuit judges the storage state of the selected differential cell, the write buffer programs the selected differential cell to the storage state again.

9. The random code generator as claimed in claim 8, wherein while the write buffer programs the selected differential cell to the storage state again, the power circuit provides the supply voltage to the control line stably.

10. A control method for a random code generator, the random code generator comprising a differential cell array, a capacitor, a voltage detector, a read/write circuit and a control circuit, the differential cell array comprising plural differential cells, each differential cell comprising two sub-cells, a first terminal of the differential cell array being connected with a control line, a second terminal of the differential cell array being connected with a word line, a third terminal of the differential cell array being connected with a first bit line, a fourth terminal of the differential cell array being connected with a second bit line, the capacitor being connected with a node, the node being connected with the control line, the voltage detector being connected with the node for detecting a node voltage of the node, the read/write circuit being connected with the first bit line and the second bit line, the control circuit being connected with the word line, the voltage detector and the read/write circuit, the control method comprising steps of:
- (a) charging the capacitor to a supply voltage;
- (b) enrolling a selected differential cell of the differential cell array according to the supply voltage of the capacitor; and
- (c) if the node voltage of the node is lower than a predetermined voltage, the read/write circuit judges a storage state of the selected differential cell and determines a bit of a random code according to the storage state of the selected differential cell.

11. The control method as claimed in claim 10, wherein before the step (c), the control method further comprises steps:
- if a descending slope of the node voltage is not higher than a predetermined descending slope, performing the step (a) again; and
- if the descending slope of the node voltage is higher than the predetermined descending slope, performing the step (c).

12. The control method as claimed in claim 10, wherein in the step (b), the supply voltage is provide from the capacitor to the control line, a ground voltage is provided to the first bit line and the second bit line, a select voltage is provided to the word line, so that one of the two sub-cells is programmed to an on state, and the other of the two sub-cells is subjected to a program inhibition and in an off state.

13. The control method as claimed in claim 10, wherein the random code generator further comprises a write buffer, and the write buffer is connected with the control circuit, the read/write circuit, the first bit line and the second bit line, wherein after the read/write circuit judges the storage state of the selected differential cell, the write buffer programs the selected differential cell to the storage state again.

14. The control method as claimed in claim 13, wherein while the write buffer programs the selected differential cell to the storage state again, the supply voltage is provided to the control line stably.

15. The control method as claimed in claim 10, wherein the selected differential cell comprises:
   a first sub-cell comprising at least one first select transistor and at least one first floating gate transistor, wherein a source terminal of the at least one first select transistor is connected with the first terminal of the differential cell array, a gate terminal of the at least one first select transistor is connected with the second terminal of the differential cell array, a drain terminal of the at least one first select transistor is connected with a source terminal of the at least one first floating gate transistor, a drain terminal of the at least one first floating gate transistor is connected with the third terminal of the differential cell array, and a gate terminal of the at least one first floating gate transistor is in a floating state; and
   a second sub-cell comprising at least one second select transistor and at least one second floating gate transistor, wherein a source terminal of the at least one second select transistor is connected with the first terminal of the differential cell array, a gate terminal of the at least one second select transistor is connected with the second terminal of the differential cell array, a drain terminal of the at least one second select transistor is connected with a source terminal of the at least one second floating gate transistor, a drain terminal of the at least one second floating gate transistor is connected with the fourth terminal of the differential cell array, and a gate terminal of the at least one second floating gate transistor is in the floating state,
   wherein the numbers of the at least one first select transistor and the at least one first floating gate transistor in the first sub-cell and the numbers of the at least one second select transistor and the at least one second floating gate transistor in the second sub-cell are equal.

16. The control method as claimed in claim 10, wherein the selected differential cell comprises:
   a first sub-cell comprising at least one first select transistor and at least one first antifuse transistor, wherein a source terminal of the at least one first select transistor is connected with the third terminal of the differential cell array, a gate terminal of the at least one first select transistor is connected with the second terminal of the differential cell array, a drain terminal of the at least one first select transistor is connected with a source terminal of the at least one first antifuse transistor, a gate terminal of the at least one first antifuse transistor is connected with the first terminal of the differential cell array, and a drain terminal of the at least one first antifuse transistor is in a floating state; and
   a second sub-cell comprising at least one second select transistor and at least one second antifuse transistor, wherein a source terminal of the at least one second select transistor is connected with the fourth terminal of the differential cell array, a gate terminal of the at least one second select transistor is connected with the second terminal of the differential cell array, a drain terminal of the at least one second select transistor is connected with a source terminal of the at least one second antifuse transistor, a gate terminal of the at least one second antifuse transistor is connected with the first terminal of the differential cell array, and a drain terminal of the at least one second antifuse transistor is in the floating state,
   wherein the numbers of the at least one first select transistor and the at least one first antifuse transistor in the first sub-cell and the numbers of the at least one second select transistor and the at least one second antifuse transistor in the second sub-cell are equal.

* * * * *